US011488651B2

(12) United States Patent
Rehmeyer et al.

(10) Patent No.: US 11,488,651 B2
(45) Date of Patent: Nov. 1, 2022

(54) SYSTEMS AND METHODS FOR IMPROVING POWER EFFICIENCY IN REFRESHING MEMORY BANKS

(71) Applicant: Micron Technology, Inc., Boise, ID (US)

(72) Inventors: James S. Rehmeyer, Boise, ID (US); Debra M. Bell, Boise, ID (US); George B. Raad, Boise, ID (US); Brian P. Callaway, Boise, ID (US); Joshua E. Alzheimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/135,403

(22) Filed: Dec. 28, 2020

(65) Prior Publication Data

US 2021/0118490 A1    Apr. 22, 2021

Related U.S. Application Data

(63) Continuation of application No. 16/247,277, filed on Jan. 14, 2019, now Pat. No. 10,885,967.

(51) Int. Cl.
*G11C 11/406* (2006.01)
*G11C 11/403* (2006.01)
*G11C 11/408* (2006.01)

(52) U.S. Cl.
CPC ...... *G11C 11/40618* (2013.01); *G11C 11/403* (2013.01); *G11C 11/4085* (2013.01)

(58) Field of Classification Search
CPC ............ G11C 11/40618; G11C 11/403; G11C 11/4085; G11C 11/4074; G11C 5/145
See application file for complete search history.

(56) References Cited

U.S. PATENT DOCUMENTS 5,020,028 A * 5/1991 Wanlass ................ G11C 11/419
257/369
2006/0221743 A1 10/2006 Jeong
(Continued)

FOREIGN PATENT DOCUMENTS

CN   101377951 A *  3/2009
JP      5343544 B2 * 11/2013  ............. G11C 5/145
KR  20160035900 A     4/2016

OTHER PUBLICATIONS

International Search Report and Written Opinion for PCT Application No. PCT/US2019/053847 dated Jan. 17, 2020.
(Continued)

*Primary Examiner* — Sultana Begum
(74) *Attorney, Agent, or Firm* — Fletcher Yoder, P.C.

(57) ABSTRACT

A memory device may include a phase driver circuit that may output a first voltage for refreshing a plurality of memory cells. The memory device may also include a plurality of word line driver circuits that may receive the first voltage via the phase driver circuit, such that each word line driver circuit of the plurality of word line driver circuits may provide the first voltage to a respective word line associated with a respective portion of the plurality of memory cells. In addition, each word line driver circuit may refresh the respective portion of the plurality of memory cells based on a respective word line enable signal provided to a first switch of the respective word line driver circuit.

18 Claims, 5 Drawing Sheets

(56) References Cited

U.S. PATENT DOCUMENTS

| | | |
|---|---|---|
| 2009/0067229 A1 | 3/2009 | Kang et al. |
| 2011/0222348 A1* | 9/2011 | Kim ........................ G11C 16/10 |
| | | 365/185.18 |
| 2012/0120752 A1* | 5/2012 | Widjaja ................... G11C 8/16 |
| | | 365/230.05 |
| 2015/0131385 A1 | 5/2015 | Lee et al. |
| 2016/0099042 A1 | 4/2016 | Lin |
| 2016/0276017 A1 | 9/2016 | Porter et al. |
| 2017/0148503 A1 | 5/2017 | Hsu et al. |

OTHER PUBLICATIONS

Extended European Search Report (EESR) for European Patent Application No. 19910176.7, dated Mar. 24, 2022, 8 pages.

* cited by examiner

SYSTEMS AND METHODS FOR IMPROVING POWER EFFICIENCY IN REFRESHING MEMORY BANKS

CROSS REFERENCE TO RELATED APPLICATIONS

This application is a continuation of and claims priority to U.S. patent application Ser. No. 16/247,277, filed Jan. 14, 2019, which is herein incorporated by reference in its entirety for all purposes.

BACKGROUND

Field of the Present Disclosure

Embodiments of the present disclosure relate generally to the field of memory devices. More specifically, embodiments of the present disclosure relate to refresh operations for memory devices.

Description of Related Art

Electronic devices, such as semiconductor devices, memory chips, microprocessor chips, image chips, and the like, may receive data for storage, operations, analysis, and the like. The data may be stored in memory devices or memory cells (e.g., double data rate fourth-generation synchronous dynamic random-access memory (DDR4)). These memory cells may store the data in capacitors that may lose their charge over time and are refreshed periodically to continue to store the data. These capacitors of the corresponding memory cells may be recharged during a refresh operation.

As the density of components disposed on electronic devices increases, the speed in which electronic devices operate increases, and the sizes of electrical components (e.g., capacitors) decrease, it may be more challenging to perform a refresh operation in memory devices. For instance, in certain types of memory bank designs (e.g., 8G and 16G), the amount of time available to perform a refresh operation may be limited due to the number of memory cells present in the memory bank that are to be refreshed. As such, to perform this refresh operation, a number of circuit components (e.g., local phase drivers) may be used to provide refresh currents (e.g., $I_{dd5b}$) to a number of rows of memory cells in each memory bank within a memory device. However, performing the refresh operation in this manner may involve cycling the number of circuit components on and off for each row of memory cells. This cyclical on and off operation inefficiently uses power while refreshing the memory cells. With this in mind, it is desirable to provide improved systems and methods for refreshing memory cells of a memory device more efficiently.

DETAILED DESCRIPTION

Figure 1:
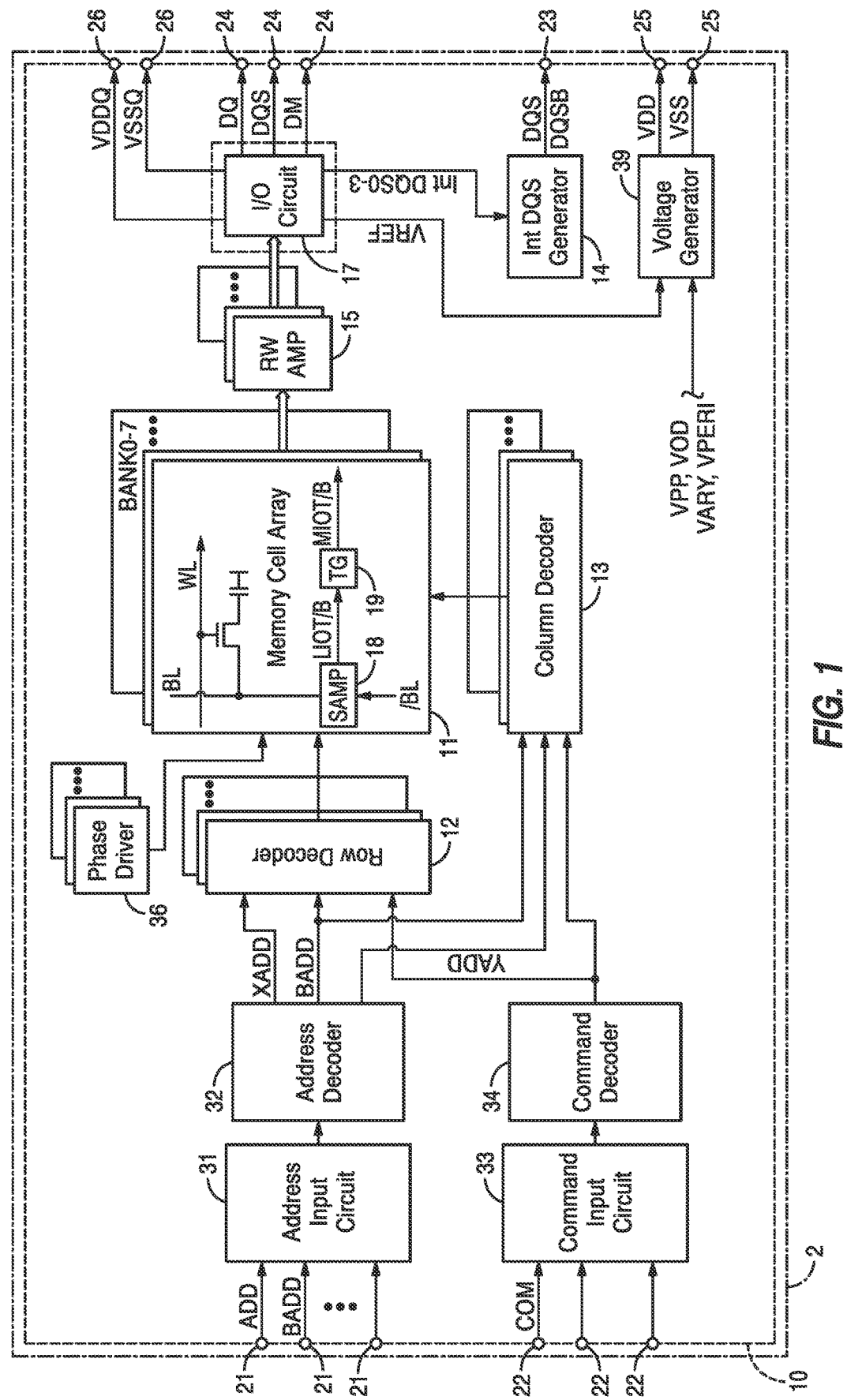
FIG. 1 is a simplified block diagram illustrating a semiconductor device that includes a phase driver for refreshing memory cells of memory banks, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As mentioned above, memory devices, such as dynamic random-access memory (DRAM) chips, may store each bit of data in a memory cell via a capacitor on the chip. As time passes, the charge in the capacitor may dissipate or leak, such that the data (e.g., voltage) of the capacitor (e.g., memory cell) may not accurately represent the data originally stored in the memory cell. To preserve the data stored in the memory cell, external circuitry periodically performs a refresh operation, which may include reading each cell and rewriting the data stored thereon, thereby maintaining the desired voltage or charge on the capacitor.

In some embodiments, circuitry (e.g., refresh pumps) may be used to refresh word lines of the memory cells. By way of example, the circuitry used to refresh word lines may include refresh pumps, which may correspond to on-chip voltage generators capable of providing voltage to respective word lines. As the density of memory banks disposed on a memory device increases, the power used to perform memory refresh operations increasingly contributes to the overall power of the memory device. For instance, row refresh cycle time (tRFC) may be 350 ns on 8G and 16G DDR4 memory designs. As such, during the row refresh cycle time (tRFC), a refresh pump may be utilized (e.g., charged and discharged) multiple times to perform refresh operations on different sets (e.g., rows) of memory cells. For example, six refresh pumps may be used to refresh six groups of different rows per bank during one refresh operation. Refreshing these groups of rows may involve turning a phase driver on and off (for each refresh pump) to provide the desired voltage to each refresh pump.

With more and larger memory banks disposed on a memory device, the phase drivers may turn on and off multiple times to perform one refresh operation on each of the memory cells of the memory device. As a result, multiple capacitors are being charged and discharged via each refresh pump. Since each of the refresh pumps is using a different phase driver, the refresh operation amounts to charging a relatively large capacitor due to the capacitance value associated with the components disposed on the phase driver for each refresh operation. Indeed, the power consumed by cycling the phase driver on and off during a refresh operation may amount to 11% of the total power (e.g., Idd5B power) used to refresh the memory device.

With the foregoing in mind, in certain embodiments, the memory device may employ the same phase driver for each of the refresh pumps used to perform a refresh operation for each of the memory cells of a memory bank. As such, the phase driver may charge and discharge one time per refresh operation, as opposed to one time per refresh pump. In this way, the total power consumed by the memory device to perform a refresh operation may be decreased (e.g., 150 mW-200 mW, 3-4% total power savings). Additional details with regard to performing the refresh operation in accordance with the embodiments described herein will be discussed below with reference to FIGS. 1-5.

Turning now to the figures, FIG. 1 is a block diagram of a semiconductor device 10, in accordance with an embodiment of the present disclosure. The semiconductor device 10 may be any suitable memory device, such as an LPDDR4 SDRAM integrated into a single semiconductor chip, for example. The semiconductor device 10 may be mounted on an external substrate 2 that is a memory module substrate, a mother board or the like. The semiconductor device 10 may include a plurality of memory banks, such that each memory bank has a plurality of memory cell arrays 11. Each memory cell array 11 may include a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local input/output (I/O) line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, data strobe (DQS) terminals 23, data (DQ) terminals 24 and power supply terminals 25 and 26. The data terminals 24 may be coupled to output buffers for read operations of memories. Alternatively, the data terminals 24 may be coupled to input buffers for read/write access of the memories.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM transmitted to the command terminals 22 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line.

Although the address terminals 21 and the command terminals 22 are illustrated in FIG. 1 as being separate terminals, it should be noted that in some embodiments the address input circuit 31 and the command input circuit 33 may receive address signals ADD and command signals COM via one or more address and command terminals. That is, the address signals ADD and command signals COM may be provided to the semiconductor device 10 via the same terminal. For instance, the address and command terminals may provide an address signal at a falling clock edge (e.g., in synchronism with clock falling edge) and a command signal at a rising clock edge (e.g., in synchronism with clock rising edge). With this in mind, it should be understood that the description provided in the present disclosure with the separate address terminals 21 and command terminals 22 is included for discussion purposes and the techniques described herein should not be limited to using separate address terminals 21 and command terminals 22.

Accordingly, when a row address command is issued with an active command, the row may be active and a write or read command may then be issued to or from a memory cell MC in the memory cell array 11 designated by the row address and column address. The read data DQ is output externally from the data terminals 24 via a read/write amplifier 15 and an input/output (IO) circuit 17. Similarly, when the write command is issued and a row address and a column address are timely supplied with the write command, and then write data DQ is supplied to the data terminals 24, the write data DQ is supplied via the input/output circuit 17 and the read/write amplifier 15 to the memory cell array 11 and written in the memory cell MC designated by the row address and the column address.

The input/output circuit 17 may include input buffers, according to one embodiment. The input/output circuit 17 receives external clock signals as a timing signal for determining input timing of write data DQ and output timing of read data DQ.

The power supply terminals 25 are supplied with power supply potentials VDD and VSS. These power supply potentials VDD and VSS are supplied to a voltage generator 39. The voltage generator 39 may generate various internal potentials VPP, VOD, VARY, VPERI, and the like based on the power supply potentials VDD and VSS. The internal potential VPP may be mainly used in the row decoder 12, the internal potentials VOD and VARY may be mainly used in the sense amplifiers 18 included in the memory cell array 11, and the internal potential VPERI may be used in many other circuit blocks.

Power supply potentials VDDQ and VSSQ are supplied to the input/output circuit 17. The power supply potentials VDDQ and VSSQ may be the same potentials as the power supply potentials VDD and VSS that are supplied to the power supply terminals 25, respectively. However, the dedicated power supply potentials VDDQ and VSSQ may be used for the input/output circuit 17 so that power supply noise generated by the input/output circuit 17 does not propagate to the other circuit blocks.

The input/output circuit 17 may also be coupled to an internal data strobe (DQS) generator circuit 14. The data strobe terminals 23 are supplied with external data strobe signals DQS and DQSB, respectively. These external data strobe signals DQS and DQSB are complementary to each other and are supplied to the internal data strobe (DQS)

generator circuit 14. The internal data strobe (DQS) generator circuit 14 may generate a plurality of internal data strobe signals (e.g., Int DQS 0-3).

Referring back to the memory cell array 11, in certain embodiments, one or more phase driver circuits 36 may provide a refresh voltage (e.g., VCCP, approximately 3.3V, 3.0-3.8 V) to the word lines WL of the memory cell array 11 via one or more word line drivers (not shown). The word line drivers may receive the refresh voltage VCCP from the phase driver circuits 36 and refresh the respective memory cells using the refresh voltage VCCP.

Figure 2:
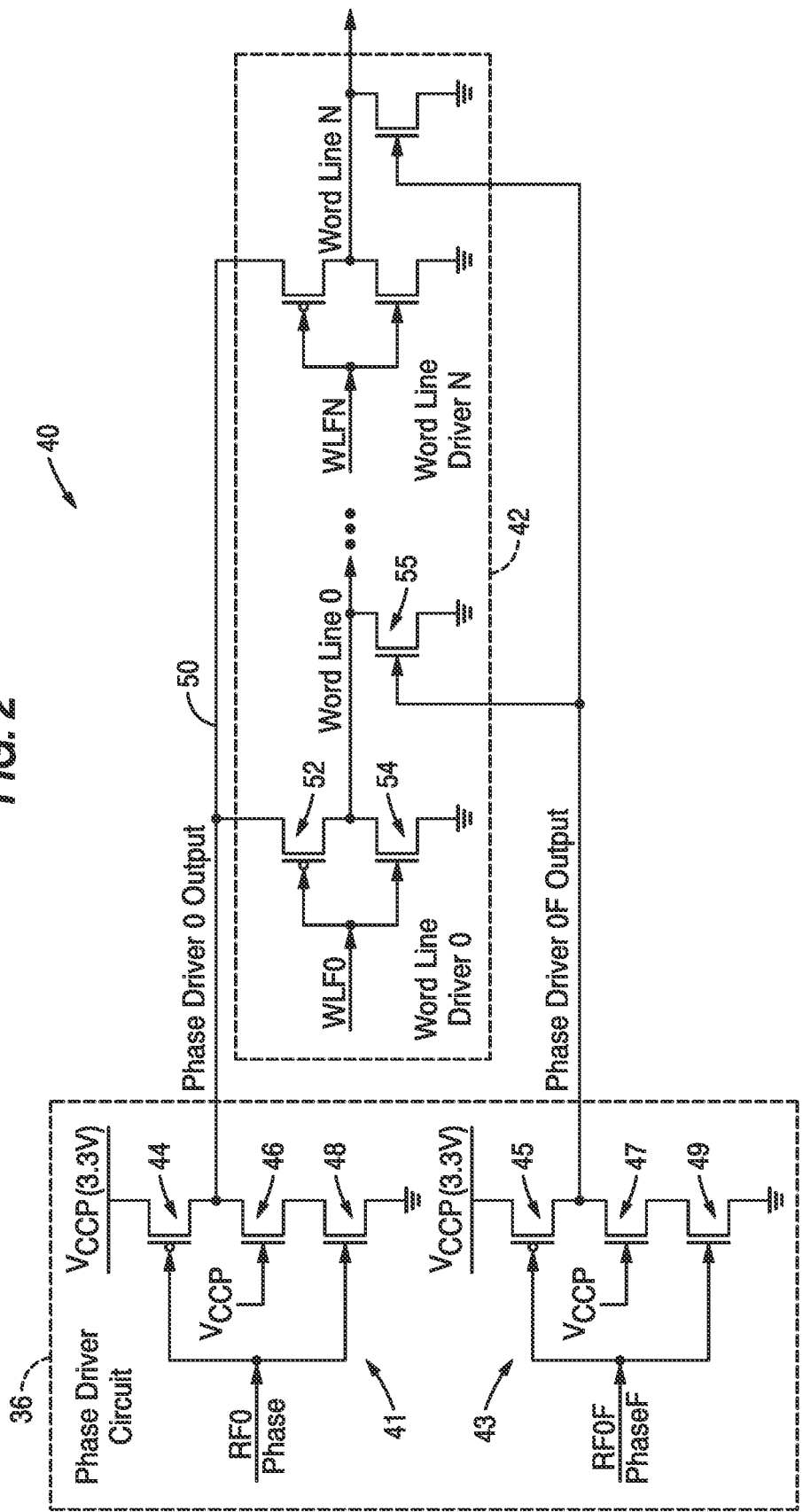
FIG. 2 is a schematic diagram illustrating a phase driver coupled to a word line driver for refreshing memory cells that may be part of the semiconductor device of FIG. 1, according to an embodiment of the present disclosure.

By way of example, FIG. 2 illustrates a schematic diagram 40 of an example phase driver circuit 36 that is coupled to a number of word line drivers 42 and provides the refresh voltage VCCP to a number of corresponding word lines WL. As shown in FIG. 2, the phase driver circuit 36 may include two phase drivers 41 and 43. The phase driver 41 may include switches 44, 46, and 48, while the phase driver 43 may include switches 45, 47, and 49. The switches 44, 45, 46, 47, 48, and 49 may correspond to any suitable electronic switch that opens and closes based on a respective gate signal. As such, the switches 44, 45, 46, 47, 48, and 49 may include, but are not limited to, Metal Oxide Semiconductor Field Effect Transistors (MOSFETs), Insulated Gate Bipolar Transistors (IGBTs), and the like. Although the switches 44 and 45 are represented as a P-type switches and the switches 46, 47, 48, and 49 are represented as N-type switches, it should be noted that the embodiments described herein may be performed with any suitable arrangement of types of switches and thus are not limited to the arrangements described herein.

By way of operation, the phase driver 41 of the phase driver circuit 36 may receive a phase signal (RF0) to initiate a refresh operation on the memory cells connected to the word line drivers 42 associated with the respective phase driver circuit 36. In some embodiments, the phase signal (RF0) may be used during a refresh operation and/or during a row activation. That is, the phase signal (RF0) may be used to initiate a firing of a phase that occurs during both refresh and row activate commands. The phase signal RF0 may be a low voltage value, which may cause the switch 44 to close and the switch 48 to open. As a result, the refresh voltage VCCP may be electrically coupled to a phase driver output line 50, which may be electrically coupled to each word line driver 42.

Each word line driver 42 may receive a respective word line enable signal (WLF0-WLFN) at the gates of switches 52 and 54 of the word line driver 42. When the word line enable signal (WLF) corresponds to a low voltage (e.g., less than a threshold voltage for the respective switch 52/54), the switch 52 may close, thereby electrically coupling the phase driver output line 50 to a respective word line WL. As shown in FIG. 2, the phase driver output line 50 may provide the refresh voltage VCCP to a number of word line drivers 42. In this way, one phase driver circuit 36 may be used to provide power to a number of word line drivers 42 (e.g., refresh pumps). By using the same phase driver circuit 36 for multiple word line drivers 42 (e.g., refresh pumps), the semiconductor device 10 may conserve power as compared to the process of charging and discharging of each word line driver 42.

In addition, the phase driver 43 of the phase driver circuit 36 may receive a second phase signal (RF0F), which may be the opposite polarity of the phase signal (RF0), to release the respective word line driver 42 from ground or a negative word line voltage (Vnwl) and enable the respective word line driver 42 to be pulled to VCCP through the phase driver 41. In some embodiments, the second phase signal (RF0F) may be used to initiate the connection of the word line driver 42 to ground or the negative word line voltage (Vnwl). That is, the second phase signal RF0F may be a low voltage value, which may cause the switch 45 to close and the switch 49 to open. As a result, the refresh voltage VCCP may be electrically coupled to a word line switch 55, which may electrically couple to the output of a respective word line driver 42 to ground.

It should be noted that the various control signals (e.g., phase signal RF0, word line enable signal WLF, second phase signal RF0F) may be provided by a controller or control system that may be part of the semiconductor device 10. Indeed, the controller or control system may coordinate the refresh operations for the memory cells of the memory cell array 11 by transmitting the various control signals to coordinate the switching of the various switch components of the phase driver circuit 36, the word line driver 42, and the like.

Keeping the foregoing in mind, as the word line drivers 42 perform refresh operations over time, the refresh voltage VCCP may cause channel hot-carrier (CHC) degradation in n-MOS transistors, such as the switches 54 and 55 of the word line driver 42. That is, refresh voltage levels that exceed some threshold value may result in degradation of the switches in the word line drivers 42 and decrease the life of the respective memory device. To mitigate the CHC degradation of the components in the word line driver 42, a voltage selector circuit may be employed to use a certain voltage level for refresh operations. That is, when re-writing the same data back into a memory cell during a refresh operation, the word line driver 42 may use a lower voltage level, as compared to the higher voltage VCCP, used to write data in the respective memory cell during a write operation. As such, in some embodiments, the voltage selector circuit may reduce the amount of voltage provided to the phase driver circuit 36 during a refresh operation. In other words, the CHC degradation of components in the word line drivers 42 may occur by using the high VCCP level while keeping the phase driver circuit 36 on and cycling through different word line drivers 42. By employing the embodiments described herein, such as using the lower voltage level, the semiconductor device 10 may keep the phase driver circuit 36 on for the entire refresh period and cycle through several word line drivers 42 without exposing the components of the word line drivers 42 to the higher voltage VCCP.

Figure 3:
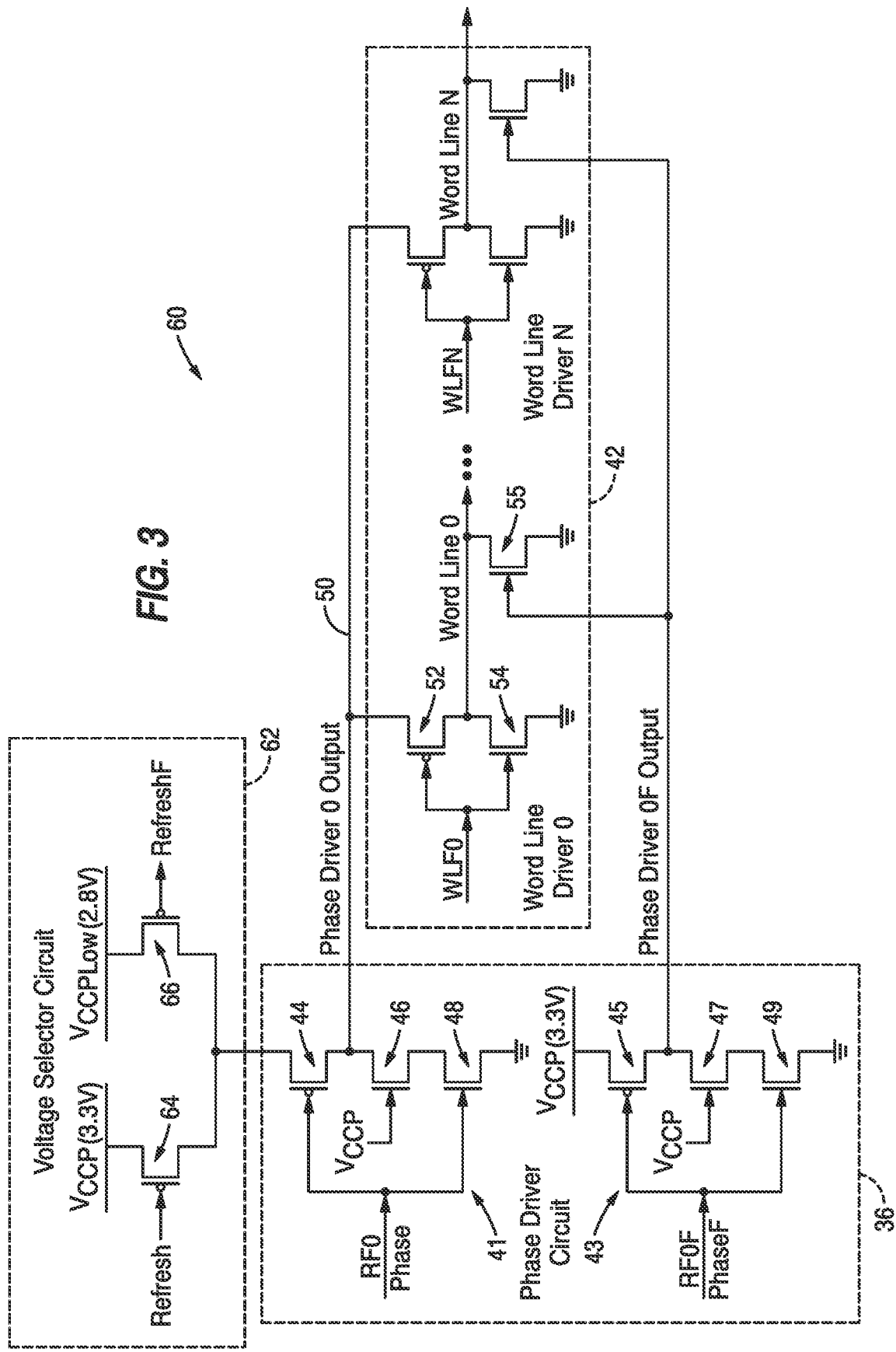
FIG. 3 is a schematic diagram illustrating a voltage selector coupled to a phase driver coupled to a word line driver for refreshing memory cells that may be part of the semiconductor device of FIG. 1, according to an embodiment of the present disclosure.

For instance, FIG. 3 illustrates a schematic diagram 60 of a voltage selector circuit 62 that may provide the phase driver circuit 36 with two voltage supplies: the non-refresh voltage supply VCCP (e.g., 3.3V) or a low refresh voltage supply (VCCPLow) (e.g., approximately 2.8V, 2.5 V-2.9 V). By way of operation, the voltage selector signal may receive a Refresh signal and a RefreshF signal (e.g., via the controller or control system of the semiconductor device 10), which may be the inverse of the Refresh signal, at switches 64 and 66, respectively. The switch 64 may electrically couple the non-refresh voltage VCCP to the phase driver circuit 36, while the switch 66 may electrically couple the low refresh voltage VCCPLow to the phase driver circuit 36 as shown. In some embodiments, when the word line driver 42 is performing a refresh operation, the voltage selector circuit 62 may receive a high voltage value (e.g., greater than a threshold voltage for the respective switch) for the Refresh signal and a low voltage value for the RefreshF signal. As a result, the switch 64 may open and the switch 66 may close, thereby electrically coupling the low refresh voltage VCCPLow to the phase driver circuit 36. The phase driver circuit 36 may, in turn, provide the low refresh voltage VCCPLow to the word line drivers 42, as described above with respect to FIG. 2. In this way, one phase driver circuit 36 may be used to power a number of word line drivers 42 (e.g., refresh pumps), while providing a lower voltage level as compared to the non-refresh voltage VCCP.

Accordingly, the switches 52 and 54 may be better protected from CHC degradation due to the decreased voltage level provided by the low refresh voltage VCCPLow. Moreover, using the low refresh voltage VCCPLow may enable the semiconductor device 10 to use a single stage charge pump during the refresh operation, thereby increasing the efficiency of the use of the total current (IDD) provided to the word line drivers 42 to 90%.

Figure 4:
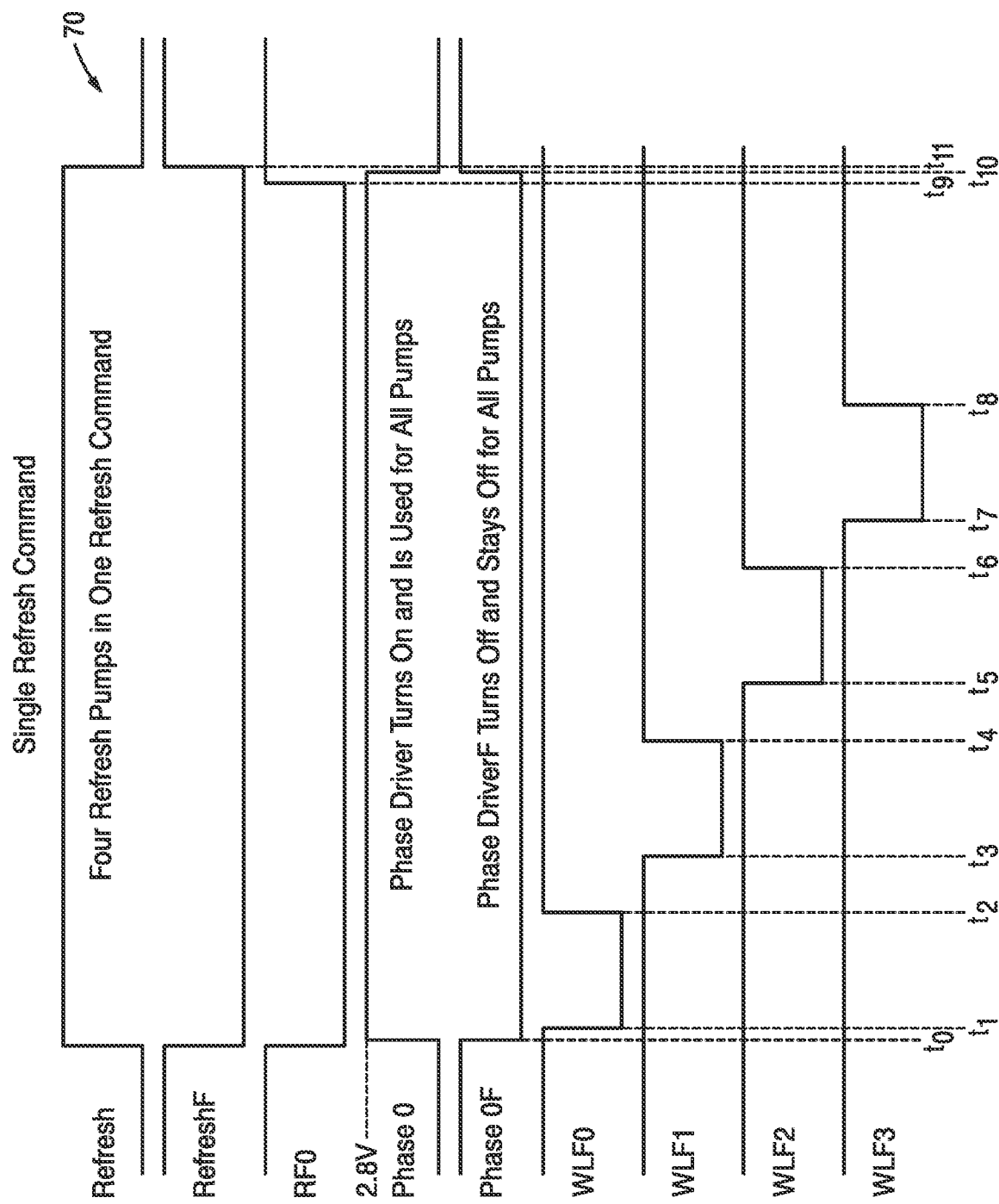
FIG. 4 is a timing diagram illustrating an example refresh operation that refreshes four word lines of a memory bank using one phase driver, according to an embodiment of the present disclosure.

With this in mind, FIG. 4 is a timing diagram 70 that illustrates an example operation related to the voltage selector circuit 62 providing phase driver output voltages at the non-refresh voltage VCCP or the low refresh voltage VCCPLow, in accordance with embodiments presented herein. As shown in FIG. 4, at time $t_0$, the Refresh signal may switch to high, the RefreshF signal may switch to low, and the phase signal RF0 may switch to low. As such, the phase driver output voltage may switch from low to high. It should be noted, however, that because the Refresh signal is high and the RefreshF signal is low, the voltage selector circuit 62 provides the low refresh voltage VCCPLow to the phase driver circuit 36.

After time $t_0$, the phase driver output voltage corresponds to the low refresh voltage VCCPLow and each of the connected word line drivers 42 receives the low refresh voltage VCCPLow via the phase driver output line 50. At this point in time, the phase driver output voltage may be equal to the low refresh voltage VCCPLow until the phase signal RF0 switches back to a high voltage at time $t_9$. As such, during this time period, the word line drivers 42 connected to the phase driver circuit 36 may be used to refresh the respective memory cells.

For example, between times $t_1$ and $t_2$, a first word line driver (WF0) may receive a word line enable signal (WLF0), which may involve switching from a high voltage value to a low voltage value. During this time period (e.g., between times $t_1$ and $t_2$), the word line 0 may receive the low refresh voltage VCCPLow to refresh the respective memory cells coupled thereto. In the same way, between times $t_3$ and $t_4$, a second word line driver (WF1) may receive a word line enable signal (WLF1), thereby providing word line 1 with the low refresh voltage VCCPLow to refresh the respective memory cells coupled thereto. This process is repeated for word line drivers WF2 and WF3, and thus may enable the phase driver circuit 36 to provide refresh power to four word line drivers 42, as opposed to switching the one phase driver circuit 36 on and off for each word line driver 42. It should be noted that the example operation described in FIG. 4 is provided with four word line drivers 42 for explanatory purposes, and any suitable number of word line drivers 42 may be coupled to the phase driver circuit 36, according to the embodiments described herein.

In addition to cycling through the word line enable signals (e.g., WLF0, WLF1) when the phase driver refresh signal RF0 is provided to the phase driver circuit 36, in some embodiments, the Refresh signal and the RefreshF signal may be pulsed to inverse voltages in between word line enable signals (WLFN) being provided to the word line drivers 42. As a result, the phase driver voltage output may decrease to eliminate the reliability risk on the switches 52 and 54 of the word line driver 42. That is, the phase driver voltage output swings between 2.8V and 3.3V, as opposed to between 0 and 3.3 V when the phase driver circuit 36 switches between off and on. The reduced voltage level of 2.8 v, as compared to 3.3V, would help protect the circuit components of the word line driver 42 from degrading while switching. That is, reducing the voltage from 3.3 V to 2.8 V removes degradation risk by limiting the voltage swing from 3.3 V to 0.5 V in between refresh pumps saves power.

Figure 5:
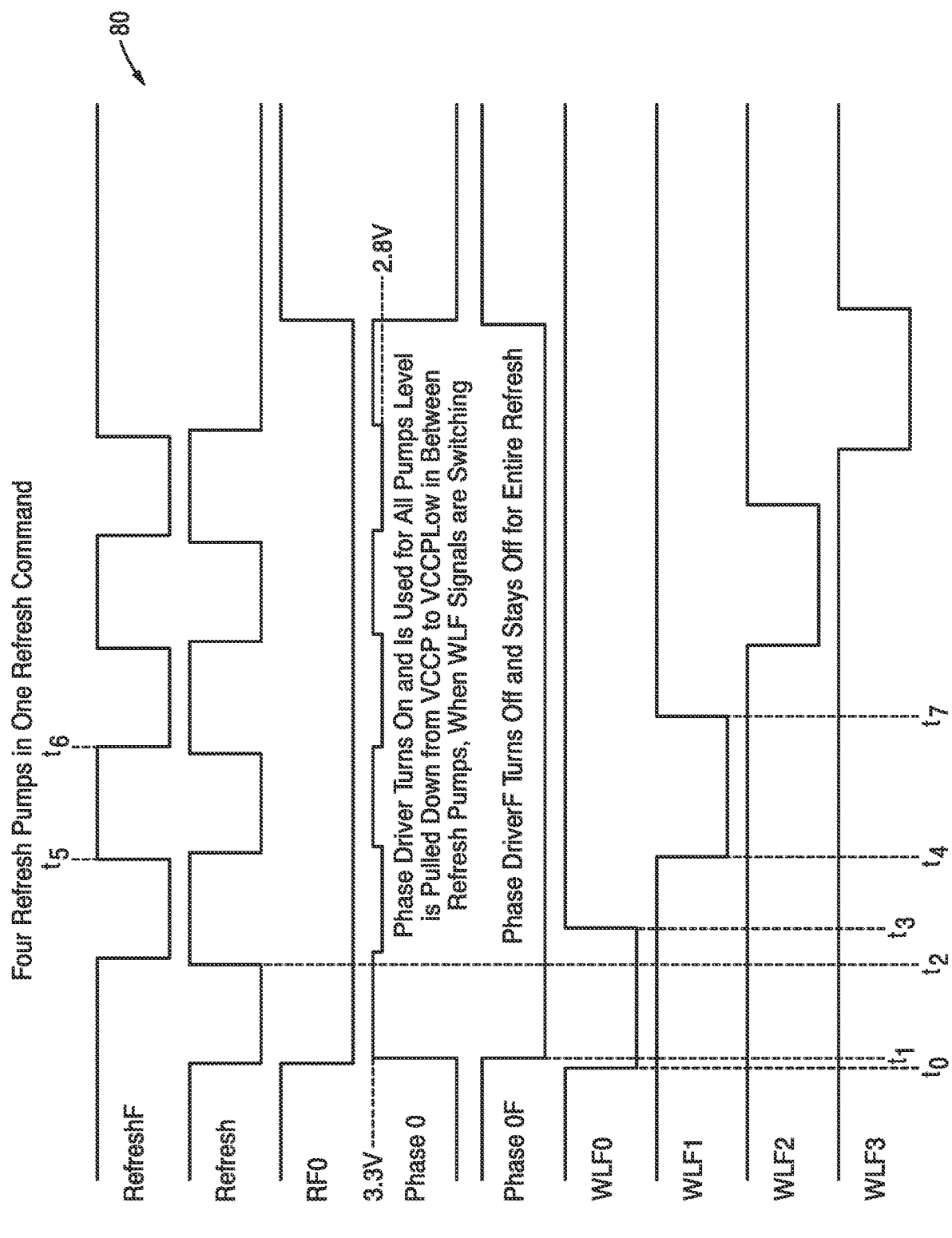
FIG. 5 is another timing diagram illustrating another example refresh operation that refreshes four word lines of a memory bank using one phase driver, according to an embodiment of the present disclosure.

With this in mind, FIG. 5 is a timing diagram 80 that illustrates how cycling through providing the Refresh and RefreshF signals to the voltage selector circuit 62 helps reduce the voltage swing of the phase driver voltage output. Referring to FIG. 5, at time $t_0$, the first word line enable signal WLF0 may be provided to the respective word line driver 42. At time $t_1$, the phase signal RF0 may be provided to the phase driver circuit 36. In addition, the Refresh signal may transition from a high voltage to a low voltage and the RefreshF signal may transition to a high voltage.

Since the Refresh signal is a low voltage and the RefreshF signal is a high voltage, the phase driver circuit 36 receives the refresh voltage VCCP (e.g., 3.3V), which is provided to the word line driver 42 via the phase driver output line 50. As such, between times $t_1$ and $t_2$, when the word line enable signal WLFO is provided to the word line driver 42, the phase driver voltage output may correspond to the voltage VCCP. At time $t_2$, the Refresh signal may transition to a high voltage and the RefreshF signal may transition to a low voltage. At time $t_3$, the word line enable signal (WLF0) returns to a high voltage, thereby disconnecting the respective word line driver 42 from the phase driver output line 50.

At time $t_4$, the second word line enable signal (WLF1) may be provided to a second word line driver 42. Between times $t_3$ and $t_4$, the voltage selector circuit 62 may output the low refresh voltage VCCPLow to the phase driver circuit 36. As such, the voltage provided to the word line driver 42 corresponds to the low refresh voltage VCCPLow. When the Refresh signal and the RefreshF signal return to the low voltage and the high voltage, respectively, at time $t_5$, the second word line driver 42 may receive the refresh voltage VCCP via the phase driver circuit 36. As a result, the word line driver 42 may receive voltages via the phase driver output line 50 that swing between the refresh voltage VCCP and the low refresh voltage VCCPLow, instead of between zero and some other voltage. Similar operations may be performed for the other word line drivers 42 that are coupled to the phase driver circuit 36, as described above, to control the voltage swing provided to the word line drivers 42.

By limiting the voltage swing that is exposed to the components of the word line driver 42, the operation of the voltage selector circuit 62, the phase driver circuit 36, and the word line driver 42, as described with respect to FIG. 5, the presently disclosed embodiments may save power by avoiding switching the phase driver circuit 36 off and on for each word line driver 42, while reducing the wear and degradation of the circuit components of the word line driver 42.

It should be noted that the refresh voltage VCCP is pulled down to the low refresh voltage VCCPLow using certain control signals provided to the various circuit components, as described above with respect to FIG. 5. However, it should also be noted that other control techniques (e.g., timing of control signals) may be employed to control the voltage swing provided to the word line drivers 42. Indeed, the presently disclosed techniques should not be limited to the embodiment described in FIG. 5. Instead, any suitable manner in which the voltage swing provided to the phase driver output line 50 may be employed using one phase driver circuit 36 for a number of word line drivers 42.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
  a plurality of memory cells;
  a word line coupled to the plurality of memory cells;
  a word line driver circuit coupled to the word line;
  a voltage selector circuit comprising a first switching device and a second switching device configured to couple to a first voltage source and a second voltage source, respectively, wherein the first switching device and the second switching device are configured to operate based on an operation mode of the word line driver circuit, and wherein the first switching device is configured to receive a first gate signal while the second switching device is configured to receive a second gate signal that is an inverse signal of the first gate signal; and
  a phase driver circuit coupled to the word line driver circuit, wherein the phase driver circuit comprises a third switching device configured to couple to the first voltage source or the second voltage source via the voltage selector circuit, wherein the third switching device is configured to receive a third gate signal configured to activate the word line driver circuit, and wherein the phase drive circuit is configured to:
    selectively supply a first voltage from the first voltage source via the first switching device to the word line driver circuit in a refresh operation mode such that the word line driver circuit activates the word line with the first voltage in the refresh operation mode; or
    selectively supply a second voltage higher than the first voltage to the word line driver circuit in another operation mode other than the refresh operation mode such that the word line driver circuit activates the word line with the second voltage in the other operation mode, wherein the first voltage is positive, and wherein the second voltage is received from the second voltage source via the second switching device.

2. The device of claim 1, wherein the phase driver circuit comprises:
  an internal voltage node coupled to the word line driver circuit, wherein the internal voltage node is coupled to the first voltage source via the first switching device or the second voltage source via the second switching device.

3. The device of claim 2, wherein the first switching device is in an on-state and the second switching device is in an off-state during the refresh operation mode.

4. The device of claim 1, wherein the refresh operation mode is initiated based on the first gate signal provided to the first switching device.

5. The device of claim 1, wherein the first voltage comprises approximately 2.8 V and the second voltage comprises approximately 3.3 V.

6. A system, comprising:
  a plurality of memory cells;
  a voltage selector circuit comprising a first switching device and a second switching device configured to couple to a first voltage source and a second voltage source, respectively, wherein the first switching device and the second switching device are configured to operate based on an operation mode of a word line driver circuit, and wherein the first switching device is configured to receive a first gate signal while the second switching device is configured to receive a second gate signal that is an inverse signal of the first gate signal; and
  a phase driver circuit configured to:
    selectively supply a first voltage from the first voltage source via the first switching device to the word line driver circuit configured to couple to a word line configured to couple to the plurality of memory cells during a refresh operation for at least one memory cell of the plurality of memory cells, such that the word line driver circuit activates the word line with the first voltage during the refresh operation; or
    selectively supply a second voltage higher than the first voltage to the word line driver circuit during another operation other than the refresh operation, such that the word line driver circuit activates the word line with the second voltage during the other operation, wherein the first voltage is positive, and wherein the second voltage is received from the second voltage source via the second switching device.

7. The system of claim 6, wherein the refresh operation corresponds to refreshing data presently stored in at least one memory cell of the plurality of memory cells.

8. The system of claim 6, wherein the other operation corresponds to writing new data into at least one memory cell of the plurality of memory cells.

9. The system of claim 6, wherein the voltage selector circuit is configured to output the first voltage in response to receiving the first gate signal and output the second voltage in response to receiving the second gate signal.

10. The system of claim 6, wherein the first voltage comprises approximately 2.8 V and the second voltage comprises approximately 3.3 V.

11. The system of claim 6, comprising an additional word line driver circuit configured to receive the first voltage or the second voltage via the phase driver circuit, wherein the additional word line driver circuit is configured to provide the first voltage or the second voltage to an additional word line associated with a respective portion of the plurality of memory cells.

12. A method, comprising:
  supplying, via circuitry, a first voltage received from a first voltage source via a first switching device of a voltage selector circuit to a word line driver circuit in response to operating in a refresh operation mode, wherein the voltage selector circuit is configured to couple to a phase driver circuit coupled to the word line driver circuit, the word line driver circuit is configured to couple to a word line configured to couple to a plurality of memory cells, such that the word line driver circuit activates the word line with the first voltage during the refresh operation mode; and supplying, via the circuitry, a second voltage higher than the first voltage to the word line driver circuit via the voltage selector circuit and the phase driver circuit in response to operating in an additional operation mode other than the refresh operation mode, such that the word line driver circuit activates the word line with the second voltage during the additional operation mode, wherein the first voltage is positive wherein the second voltage is received at the word line driver circuit from a second voltage source via a second switching device of the voltage selector circuit and a third switching device of the phase driver circuit, wherein the first switching device is configured to receive a first gate signal while the second switching device is configured to receive a second gate signal that is an inverse signal of the first gate signal, and wherein the third switching device is configured to receive a third gate signal configured to activate the word line driver circuit.

13. The method of claim 12, wherein operating in the refresh operation mode comprises receiving the third gate signal configured to cause the third switching device to close, wherein the third switching device is configured to couple the first voltage source or the second voltage source to the word line driver circuit.

14. The method of claim 13, wherein operating in the refresh operation mode comprises receiving the third gate signal configured to cause a fourth switching device to open, wherein the fourth switching device is configured to couple a third voltage source to the phase driver circuit, and wherein the third voltage source is different from the first voltage source and the second voltage source.

15. The method of claim 14, wherein the third switching device comprises a PMOS semiconductor device and the fourth switching device comprises an NMOS semiconductor device.

16. The method of claim 12, wherein the first voltage corresponds to writing new data in at least one of the plurality of memory cells.

17. The method of claim 12, comprising receiving, via the circuitry, a word line enable signal at a gate of the third switching device in the word line driver circuit, wherein the word line enable signal is configured to cause the word line driver circuit to provide the first voltage or the second voltage to a portion of the plurality of memory cells.

18. The method of claim 12, wherein the first voltage comprises approximately 2.8 V and the second voltage comprises approximately 3.3 V.

* * * * *